United States Patent
Park et al.

(10) Patent No.: US 11,410,589 B2
(45) Date of Patent: Aug. 9, 2022

(54) DISPLAY DEVICE

(71) Applicant: Samsung Display Co., Ltd., Yongin-si (KR)

(72) Inventors: Po-Yun Park, Seoul (KR); Deok-Hwan Kim, Asan-si (KR); Seungjae Kang, Asan-si (KR); Sanghak Yi, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/434,441

(22) PCT Filed: Apr. 16, 2020

(86) PCT No.: PCT/KR2020/005107
§ 371 (c)(1),
(2) Date: Aug. 27, 2021

(87) PCT Pub. No.: WO2020/222447
PCT Pub. Date: Nov. 5, 2020

(65) Prior Publication Data
US 2022/0148481 A1    May 12, 2022

(30) Foreign Application Priority Data

May 2, 2019 (KR) .......... 10-2019-0051268

(51) Int. Cl.
*G09G 3/20* (2006.01)
(52) U.S. Cl.
CPC ....... *G09G 3/20* (2013.01); *G09G 2300/0404* (2013.01); *G09G 2300/0426* (2013.01)

(58) Field of Classification Search
CPC ............ G09G 3/20; G09G 2300/0404; G09G 2300/0426
See application file for complete search history.

(56) References Cited

U.S. PATENT DOCUMENTS

| | | | |
|---|---|---|---|
| 9,042,108 B2 | 5/2015 | Nobori | |
| 9,398,687 B2 | 7/2016 | Park | |

(Continued)

FOREIGN PATENT DOCUMENTS

| | | | |
|---|---|---|---|
| JP | H 4147223 A | 5/1992 | |
| JP | 3549760 B2 | 8/2004 | |

(Continued)

OTHER PUBLICATIONS

International Search Report dated Jul. 27, 2020 for PCT/KR2020/005107.

*Primary Examiner* — Sejoon Ahn
(74) *Attorney, Agent, or Firm* — Cantor Colburn LLP (57) ABSTRACT

A display device includes a display panel, a first connection film, and a second connection film. The display panel includes first pads and second pads. The first connection film includes a first film, which includes a first region connected to the first pads and having a first width and a second region adjacent to the first region and having a second width different from the first width, and a first driving chip mounted on the first film. The second connection film includes a second film, which includes a third region connected to the second pads and having a third width and a fourth region adjacent to the third region and having a fourth width different from the third width and less than the second width, and a second driving chip mounted on the second film.

20 Claims, 11 Drawing Sheets

(56) References Cited

U.S. PATENT DOCUMENTS

| | | | |
|---|---|---|---|
| 10,037,984 B2 | 7/2018 | Oh | |
| 10,268,241 B2 | 4/2019 | Lee et al. | |
| 10,499,508 B2 | 12/2019 | Ahn et al. | |
| 10,802,266 B1 * | 10/2020 | Sakai | G02B 26/005 |
| 10,803,778 B1 * | 10/2020 | Pande | G09G 3/20 |
| 2018/0004344 A1 | 1/2018 | Park et al. | |
| 2018/0011514 A1 | 1/2018 | Yoo et al. | |
| 2018/0075810 A1 | 3/2018 | Kim et al. | |

FOREIGN PATENT DOCUMENTS

| | | |
|---|---|---|
| JP | 5719993 B2 | 5/2015 |
| KR | 1020170098373 A | 8/2017 |
| KR | 1020180027692 A | 3/2018 |
| KR | 101886305 B1 | 8/2018 |
| KR | 1020190006153 A | 1/2019 |

* cited by examiner

DISPLAY DEVICE

This application claims priority to Korean Patent Application No. 10-2019-0051268, filed on May 2, 2019, and all the benefits accruing therefrom under 35 U.S.C. § 119, the content of which in its entirety is herein incorporated by reference.

TECHNICAL FIELD

The present invention relates to a display device having improved reliability.

BACKGROUND ART

In general, after a display panel is manufactured, a connection film may be attached to the display panel and a main circuit board to connect the display panel to the main circuit board. For example, in a tape automated bonding ("TAB") mounting method, the connection film may be bonded to the display panel and the main circuit board by using an anisotropic conductive film ("ACF").

TECHNICAL PROBLEM

An aspect of the present invention is to provide a display device having improved reliability.

TECHNICAL SOLUTION

A display device according to an embodiment of the present invention includes a display panel, a first connection film, and a second connection film. The display panel includes first pads arranged in a first direction and second pads arranged in the first direction and spaced apart from the first pads in a second direction crossing the first direction. The first connection film includes 1) a first film, which includes a first region connected to the first pads and having a first width in the first direction and a second region adjacent to the first region in the second direction and having in the first direction a second width that is different from the first width, and 2) a first driving chip mounted on the first film. The second connection film includes a second film, which includes a third region connected to the second pads and having a third width in the first direction and a fourth region adjacent to the third region in the second direction and having in the first direction a fourth width that is different from the third width and less than the second width, and 2) a second driving chip mounted on the second film.

The first width may be greater than the second width, and the third width may be greater than the fourth width.

A length of the first region in the second direction may be greater than a length of the third region in the second direction.

The first region and the third region may overlap each other in a plan view.

An area of the first connection film may be greater than an area of the second connection film.

The first driving chip may be disposed on a bottom surface of the first film, and the second driving chip may be disposed on a bottom surface of the second film.

The first driving chip may be disposed in the second region, and the second driving chip may be disposed in the third region.

The first driving chip may not overlap the second connection film in the plan view, and the second driving chip may overlap the first connection film in the plan view.

The first driving chip may be disposed on a top surface of the first film, and the second driving chip may be disposed on a bottom surface of the second film.

The first driving chip may overlap the second film in the plan view, and the second driving chip may overlap the first film in the plan view.

The first driving chip may be disposed in the second region, and the second driving chip may be disposed in the fourth region.

A portion of a bottom surface of the first film and a portion of a top surface of the second film may be in contact with each other.

The display device may further include a main circuit board connected to the second region and the fourth region.

A display device according to an embodiment of the present invention includes: a display panel including a substrate which includes a display area and a non-display area, first pads disposed on the non-display area, and second pads disposed on the non-display area and spaced apart from the non-display area with the first pads therebetween; a main circuit board electrically connected to the display panel; a first connection film including 1) a first film, which includes a first region connected to the first pads and a second region connected to the main circuit board and protruding from the first region, and 2) a first driving chip mounted on the first film; and a second connection film disposed under the first connection film, the second connection film including 1) a second film, which includes a third region connected to the second pads and a fourth region connected to the main circuit board and protruding from the third region, and 2) a second driving chip mounted on the second film, where the second region has a width greater than a width of the fourth region.

The first pads may be arranged in a first direction, the second pads may be arranged in the first direction, and the width of the second region and the width of the fourth region may be defined as widths in a direction parallel to the first direction.

The first region may have a width in the first direction greater than that the width of the second region, and the third region may have a width in the first direction greater than that the width of the fourth region.

The first driving chip may be disposed on a bottom surface of the second region, and the second driving chip may be disposed on a bottom surface of the third region.

The first driving chip may not overlap the second film in the plan view, and the second driving chip may overlap the first film in the plan view.

The first driving chip may be disposed on a top surface of the second region, and the second driving chip may be disposed on a bottom surface of the fourth region.

The first driving chip may overlap the second film in the plan view, and the second driving chip may overlap the first film in the plan view.

ADVANTAGEOUS EFFECTS

According to the present invention, the first connection film may include the first film and the first driving chip, and the second connection film may include the second film and the second driving chip. When the main circuit board and the first connection film and the second connection film are coupled to each other, the first driving chip and the second driving chip, the first driving chip and the second film, and the second driving chip and the first film may not be in contact with each other. Therefore, the first driving chip and the second driving chip may be effectively prevented from being damaged. Also, since there is no gap between the first connection film and the second connection film due to the first driving chip and the second driving chip, when the first connection film and the second connection film and the main circuit board are connected to each other, the misalignment between the first and second connection film and the main circuit board may be effectively prevented. Therefore, the display device having the improved reliability may be provided.

MODE FOR CARRYING OUT THE INVENTION

In this specification, it will also be understood that when one component (or region, layer, portion) is referred to as being "on", "connected to", or "coupled to" another component, it can be directly disposed/connected/coupled on/to the one component, or an intervening third component may also be present.

Like reference numerals refer to like elements throughout. Also, in the figures, the thickness, ratio, and dimensions of components are exaggerated for clarity of illustration.

The term "and/or" includes any and all combinations of one or more of the associated listed items.

It will be understood that although the terms such as 'first' and 'second' are used herein to describe various elements, these elements should not be limited by these terms. The terms are only used to distinguish one component from other components. For example, a first element referred to as a first element in an embodiment can be referred to as a second element in another embodiment without departing from the scope of the appended claims. The terms of a singular form may include plural forms unless referred to the contrary.

Also, ""under", "below", "above', "upper", and the like are used for explaining relation association of components illustrated in the drawings. The terms may be a relative concept and described based on directions expressed in the drawings.

Unless otherwise defined, all terms (including technical and scientific terms) used herein have the same meaning as commonly understood by a person of ordinary skill in the art to which this invention belongs. Also, terms such as defined terms in commonly used dictionaries are to be interpreted as having meanings consistent with meaning in the context of the relevant art and are expressly defined herein unless interpreted in an ideal or overly formal sense.

The meaning of "include" or "comprise" specifies a property, a fixed number, a step, an operation, an element, a component or a combination thereof, but does not exclude other properties, fixed numbers, steps, operations, elements, components or combinations thereof.

Hereinafter, embodiments of the present invention will be described with reference to the accompanying drawings.

Figure 1:
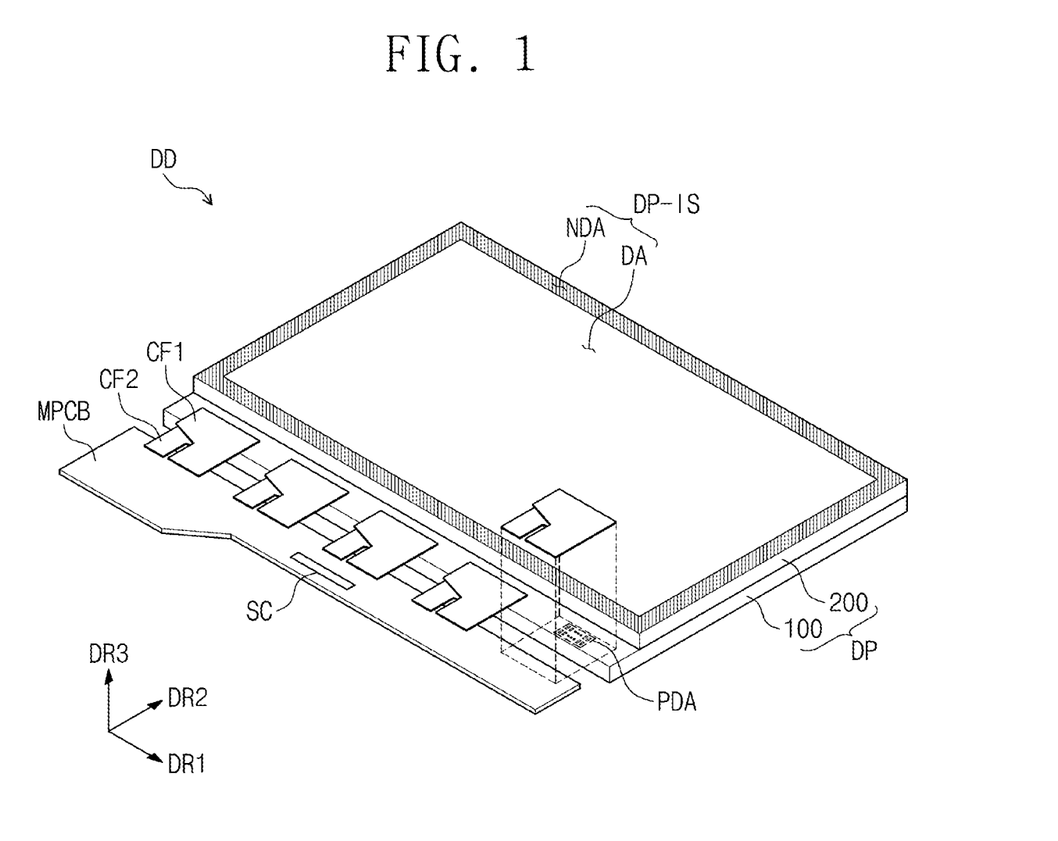
FIG. 1 is a perspective view of a display device according to an embodiment of the present invention.

FIG. 1 is a perspective view of a display device according to an embodiment of the present invention.

Referring to FIG. 1, a display device DD may include a display panel DP, a first connection film CF1, a second connection film CF2, and a main circuit board MPCB.

The display panel DP may include a non-emissive display panel or an emissive display panel. The non-emissive display panel may be, for example, a liquid crystal display panel. The liquid crystal display panel may include a backlight unit. The emissive display panel may be, for example, an organic light emitting display panel or a quantum dot light emitting display panel. An emission layer of the organic light emitting display panel may include an organic light emitting material. This is merely an example, and, in the present invention, the display panel DP is not particularly limited thereto.

The display panel DP may include a first substrate 100 (or a lower substrate) and a second substrate 200 (or an upper substrate) on the first substrate 100 to face the first substrate 100. A gradation display layer for generating an image may be disposed between the first substrate 100 and the second substrate 200. The gradation display layer may include a liquid crystal layer, an organic light emitting layer, and an electrophoretic layer according to kinds of display panels.

The display panel DP may display an image through a display surface DP-IS. The display surface DP-IS may be a surface that is parallel to a surface defined by a first direction DR1 and a second direction DR2. The display surface DP-IS may include a display area DA and a non-display area NDA adjacent to the display area DA. The non-display area NDA may be defined along an edge of the display surface DP-IS. The display area DA may be surrounded by the non-display area NDA. In an embodiment of the present invention, the non-display area NDA may be disposed on only a side of display surface DP-IS adjacent to the first connection film CF1 and the second connection film CF2.

A normal direction of the display surface DP-IS, i.e., a thickness direction of the display panel DP is indicated as a third direction DR3. A front surface (or a top surface) and a rear surface (or a bottom surface) of each of layers or units, which will be described below, may be distinguished from each other by the third direction DR3. The third direction DR3 may be a direction crossing the first direction DR1 and the second direction DR2. The first direction DR1, the second direction DR2, and the third direction DR3 may cross each other at right angles.

The directions indicated as the first to third direction DR1, DR2, and DR3 may be a relative concept and thus changed into different directions. Hereinafter, the first to third directions may be directions indicated by the first to third direction DR1, DR2, and DR3 and designated by the same reference numerals, respectively. Also, in this specification, a surface defined by the first direction DR1 and the second direction DR2 may be defined as a plane, and "when viewed in the plan view" may be defined as viewed in the third direction DR3.

Although the display panel DP having a planar display surface DP-IS is illustrated in an embodiment of the present invention, the embodiment of the present invention is not limited thereto. The display panel DP may include a curved display surface or a solid display surface. The solid display surface may include a plurality of display areas that indicate different directions.

A signal control part SC may be mounted on the main circuit board MPCB. The signal control part SC may receive image data and a control signal from an external graphic control part (not shown). The signal control part SC may provide the control signal to the display panel DP.

The first connection film CF1 may be electrically connected to the display panel DP and the main circuit board MPCB. The second connection film CF2 may be electrically connected to the display panel DP and the main circuit board MPCB. Each of the first and second connection films CF1 and CF2 may transmit signals from the main circuit board MPCB to the display panel DP. In an embodiment of the present invention, each of the first connection film CF1 and the second connection film CF2 may transmit a signal from the signal control part SC to the display panel DP.

In this embodiment, the first connection film CF1 and the second connection film CF2 may be connected to different pads disposed on one pad area PDA. Although the pad area PDA is disposed on the first substrate 100 in this embodiment, the embodiment of the present invention is not limited thereto. According to another embodiment of the present invention, the pad area PDA may be disposed on the second substrate 200.

Figure 2:
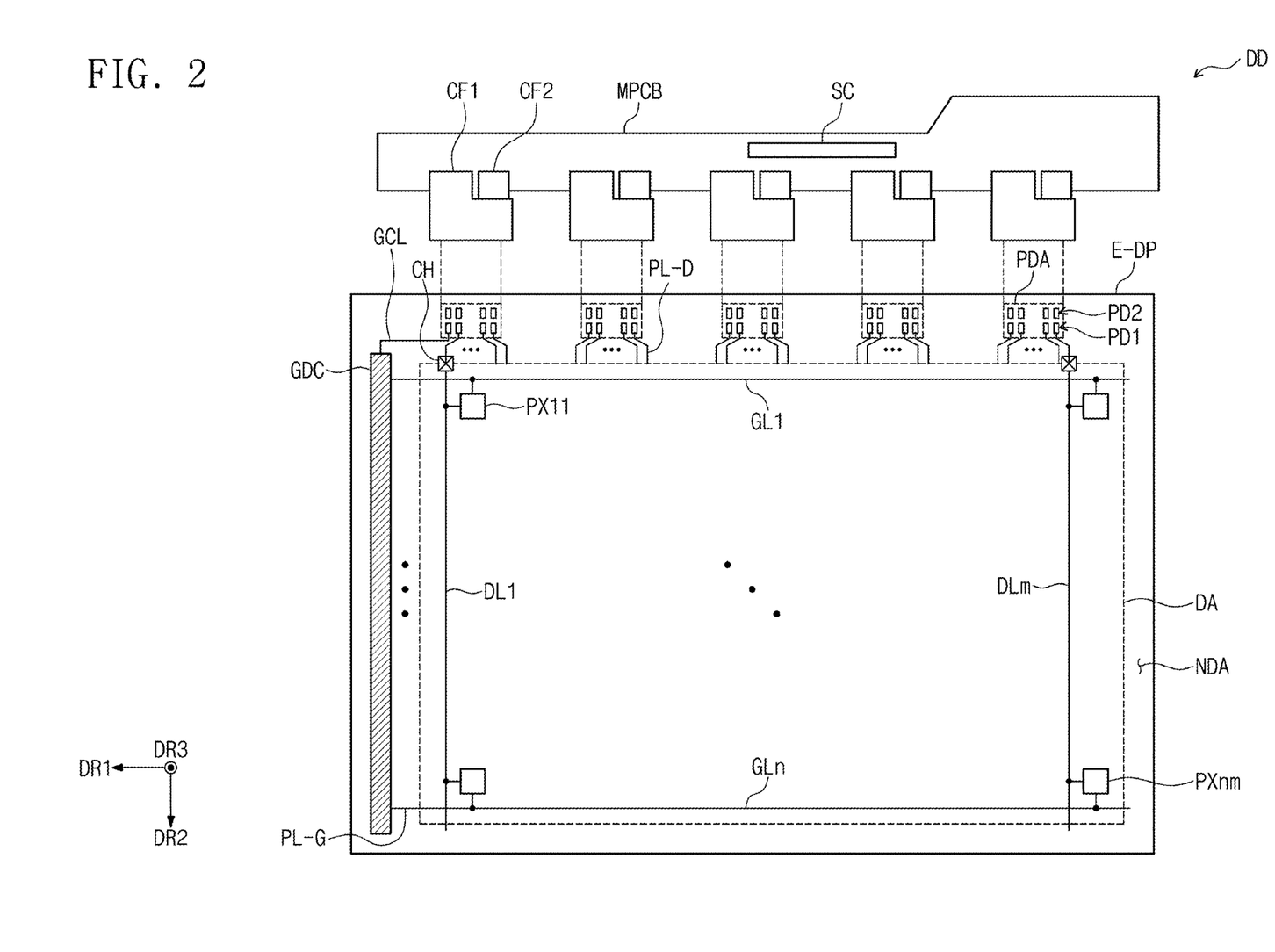
FIG. 2 is a plan view illustrating a portion of the display device according to an embodiment of the present invention.

FIG. 2 is a plan view illustrating a portion of the display device according to an embodiment of the present invention.

Referring to FIG. 2, signal lines may include a plurality of gate lines GL1 to GLn, a plurality of data lines DL1 to DLm, auxiliary signal lines PL-G and PL-D, and a gate control line GCL.

The plurality of gate lines GL1 to GLn may extend in the first direction DR1 and be arranged in the second direction DR2. The plurality of data lines DL1 to DLm may be insulated from and cross the plurality of gate lines GL1-GLn. For example, the plurality of data lines DL1 to DLm may extend in the second direction DR2 and be arranged in the first direction DR1. The plurality of gate lines GL1 to GLn and the plurality of data lines DL1 to DLm may be disposed to overlap the display area DA. The auxiliary signal lines PL-G and PL-D may be disposed to overlap the non-display area NDA. The auxiliary signal lines PL-G and PL-D may be connected to the plurality of gate lines GL1 to GLn and the plurality of data lines DL1 to DLm.

The first auxiliary signal lines PL-G connected to the plurality of gate lines GL1 to GLn may be disposed on the same line as the plurality of gate lines GL1 to GLn and be integrated with the plurality of gate lines GL1 to GLn. In this embodiment, the structure in which the plurality of gate lines GL1-GLn and the first auxiliary signal lines PL-G are divided has been described, but the gate line and the first auxiliary signal line, which are connected to each other, are defined as one signal line. Here, the gate line and the first auxiliary signal line, which are connected to each other, may be defined as different portions of one signal line.

The second auxiliary signal lines PL-D connected to the data lines DL1 to DLm may be disposed on a layer different from a layer on which the plurality of data lines DL1 to DLm are disposed. The data lines DL1 to DLm may be electrically connected to corresponding signal lines of the second auxiliary signal lines PL-D through a contact hole CH. The second auxiliary signal lines PL-D may include first auxiliary data signal lines connected to the first pads PD1 and second auxiliary data signal lines connected to the second pads PD2.

The contact holes CH may pass through at least one insulating layer disposed between the data lines DL1 to DLm and the second auxiliary signal lines PL-D. In FIG. 2, two contact holes CH are illustrated as an example. In another embodiment of the present invention, the contact hole CH may be omitted. The data lines DL1 to DLm and the second auxiliary signal lines PL-D may be disposed on the same layer. Here, the data line and the second auxiliary signal line, which are connected to each other, among the data lines DL1 to DLm and the second auxiliary signal lines PL-D may be defined as one signal line. The data line and the second auxiliary signal line, which are connected to each other, may be defined as different portions of one signal line.

Pixels PX11 to PXnm may be disposed on the display area DA. "n" and m" are natural numbers. The pixels PX11 to PXnm may not be disposed on the non-display area NDA. Each of the pixels PX11 to PXnm may be connected to the corresponding gate line of the plurality of gate lines GL1 to GLn and the corresponding data line of the plurality of data lines DL1 to DLm, respectively. Each of the pixels PX11 to PXnm may include a pixel driver circuit and a display element.

Although the pixels PX11 to PXnm having the form of a matrix are illustrated as an example, the embodiment of the present invention is not limited thereto. The pixels PX11 to PXnm may be disposed in the form of a pentile in another embodiment. The pixels PX11 to PXnm may be disposed in the form of a diamond in still another embodiment.

The first pads PD1 and the second pads PD2 may be disposed on the pad areas PDA, respectively. Each of the first pads PD1 and the second pads PD2 may include a plurality of pads, which are arranged in the first direction DR1. The first pads PD1 may be disposed to be spaced apart from the second pads PD2 in the second direction DR2.

The first pads PD1 may be disposed farther apart from the edge E-DP of the display panel DP than the second pads PD2 and be disposed closer to the display area DA. Each of the first pads PD1 and the second pads PD2 may be connected to each of the second auxiliary signal lines PL-D.

As resolution of the display panel DP increases, an area of each of the pixels PX11-PXnm may decrease, and a larger number of pixels PX11-PXnm may be disposed on a unit area. If the pads are arranged only in a row, a larger area of the pad area PDA may be desirable, and defects such as circuit short between the pads may occur. In order to prevent this circuit short from occurring, a design of a pad having a fine pitch may be desirable, which may cause bonding failure. According to the present embodiment, the above-described problem may be solved by separating the pads into two groups, such as the first pads PD1 and the second pads PD2.

A gate driver circuit GDC may be integrated with the display panel DP through an oxide silicon gate driver circuit ("OSG") process or an amorphous silicon gate driver circuit ("ASG") process. The oxide silicon gate driver circuit (OSG) may include an oxide silicon thin film transistor in which transistors of the gate driver circuit GDC include an oxide semiconductor. The amorphous silicon gate driver circuit (ASG) may include an amorphous silicon thin film transistor in which transistors of the gate driver circuit GDC include an amorphous semiconductor. The first auxiliary signal lines PL-G may receive a gate signal from the gate driver circuit GDC.

In FIG. 2, the gate control line GCL connected to one of the first pads PD1 is illustrated, but the invention is not limited thereto. For example, the gate control line GCL may be connected to one of the first pads PD1 and then be connected to the signal control part SC and the gate driver circuit GDC through the first connection film CF1, or the control line GCL may be connected to any one of the second pads PD2 and then be connected to the signal control part SC and the gate driver circuit GDC through the second connection film CF2.

Figure 3:
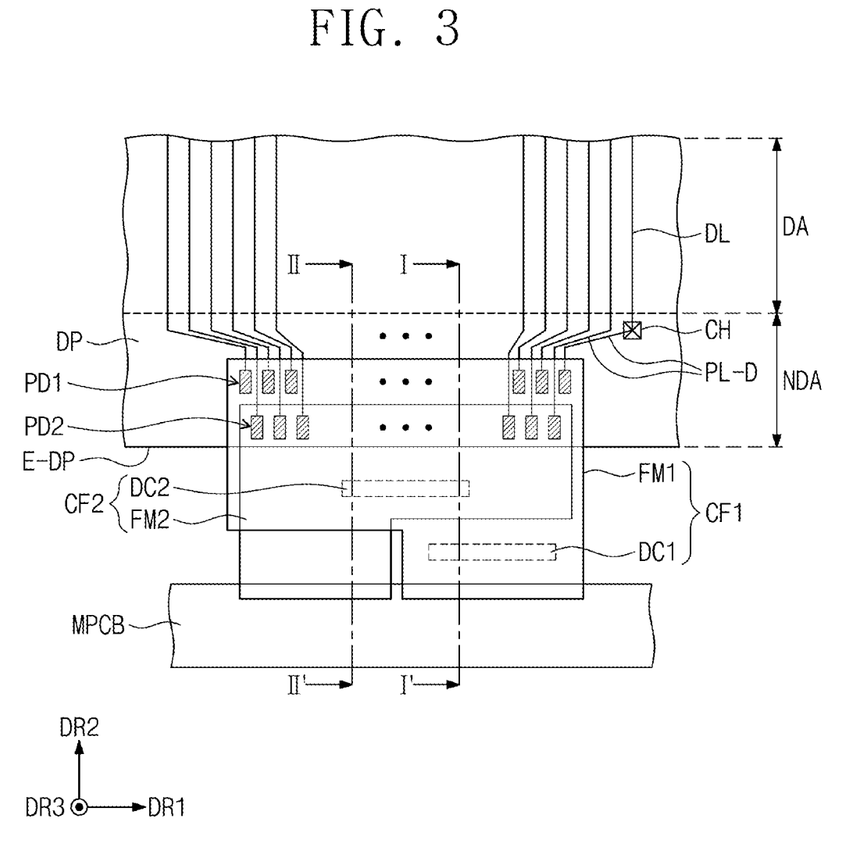
FIG. 3 is an enlarged plan view of the display device according to an embodiment of the present invention.

FIG. 3 is an enlarged plan view of the display device according to an embodiment of the present invention.

Referring to FIG. 3, output pads of the first connection film CF1 and the second connection film CF2 may overlap the pad area PDA (see FIG. 2) in a plan view.

The pad area PDA (see FIG. 2) may be disposed on the non-display area NDA. First pads PD1 and second pads PD2 forming different rows may be disposed on the pad area PDA (see FIG. 2). The first connection film CF1 may be electrically connected to the first pads PD1. The second connection film CF2 may be electrically connected to the second pads PD2.

The first connection film CF1 may include a first film FM1 and a first driving chip DC1. The second connection film CF2 may include a second film FM2 and a second driving chip DC2. The first connection film CF1 may be disposed on the second connection film CF2.

In a plan view, the first driving chip DC1 may not overlap the second connection film CF2. In a plan view, the second driving chip DC2 may overlap the first connection film CF1.

The main circuit board MPCB may be electrically connected to the display panel DP by the first connection film CF1 and the second connection film CF2. In a plan view, the input pad of the first connection film CF1 and the input pad of the second connection film CF2 may overlap the main circuit board MPCB.

Figure 4A:
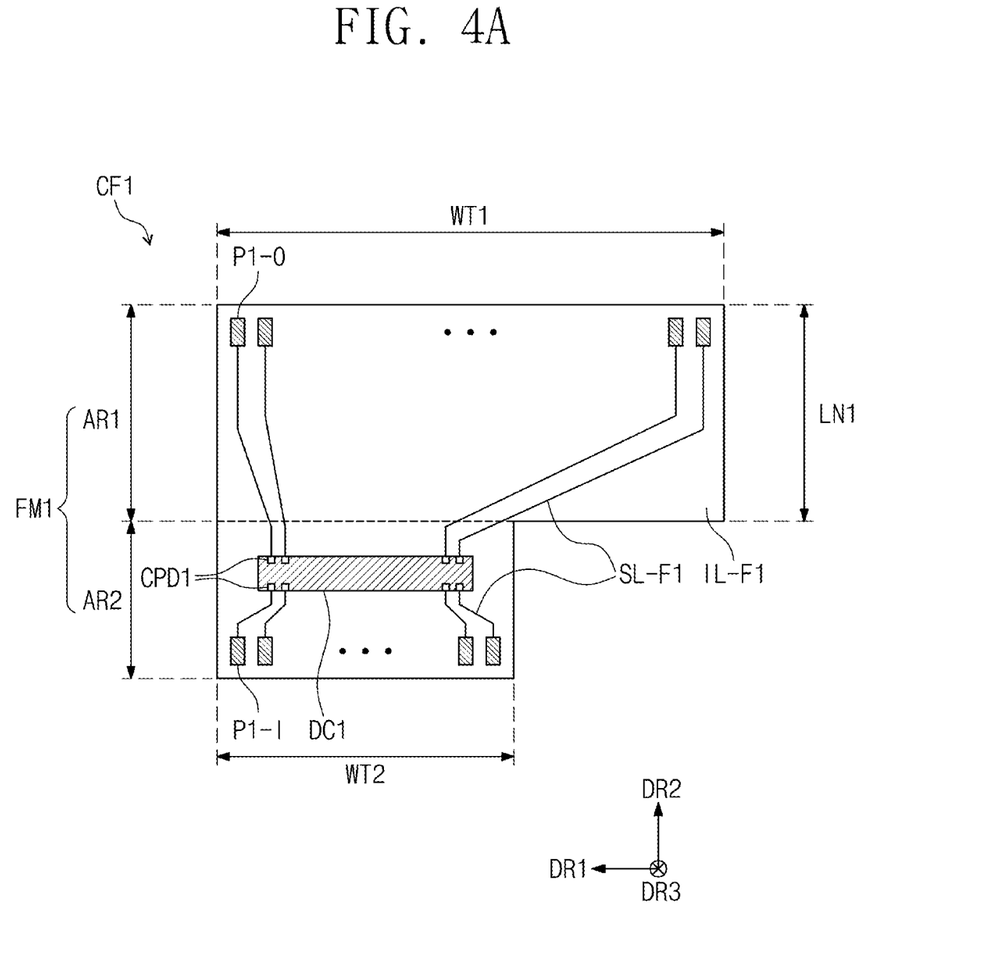
FIG. 4A is a rear view of a first connection film according to an embodiment of the present invention.
Figure 4B:
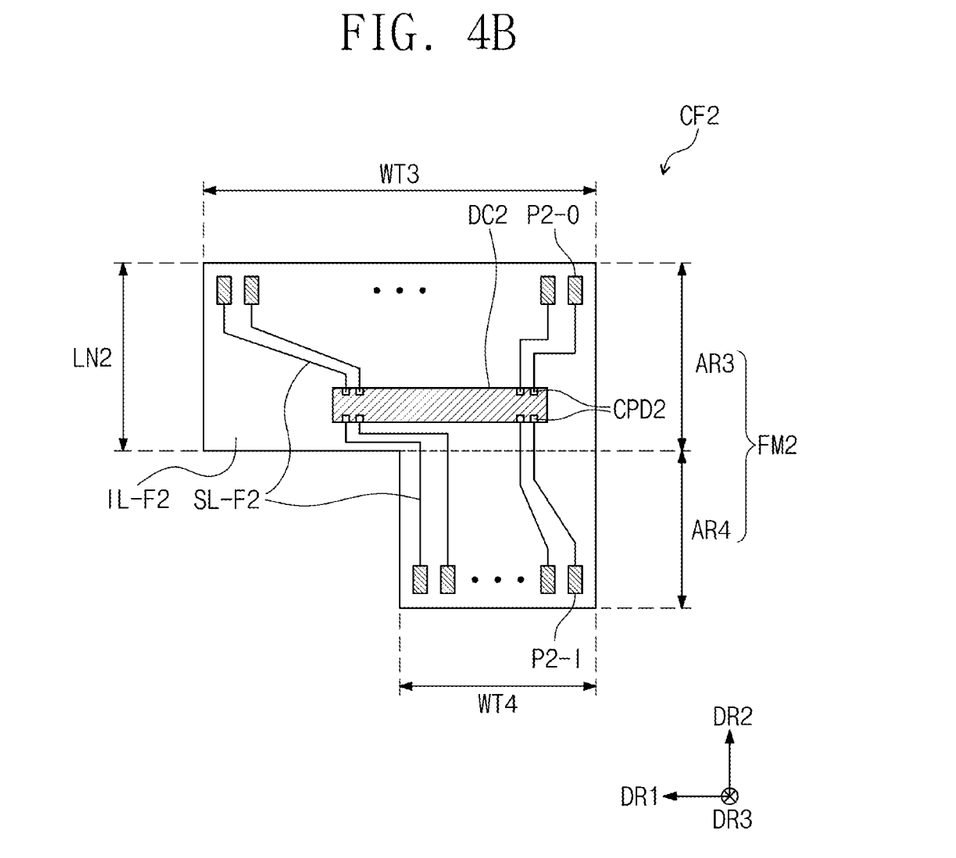
FIG. 4B is a rear view of a second connection film according to an embodiment of the present invention.

FIG. 4A is a rear view of the first connection film according to an embodiment of the present invention, and FIG. 4B is a rear view of the second connection film according to an embodiment of the present invention.

Referring to FIGS. 4A and 4B, the first film FM1 may include a first insulating layer IL-F1, a plurality of pads CPD1, P1-0, and P1-1, and a plurality of first signal lines SL-F1. The plurality of pads CPD1, P1-0, and P1-1 and the plurality of first signal lines SL-F1 may be disposed on the first insulating layer. The first insulating layer may include a polyimide layer.

The plurality of pads CPD1, P1-0, and P1-1 may include first connection pads CPD1 connected to connection terminals of the first driving chip DC1, first output pads P1-0 connected to the display panel DP (see FIG. 1), and first input pads P1-1 connected to the main circuit board MPCB (see FIG. 1). A portion of the plurality of first signal lines SL-F1 may connect the first connection pads CPD1 to the first output pads P1-0, and the other portion of the plurality of first signal lines SL-F1 may connect the first connection pads CPD1 to the first input pads P1-1.

The first film FM1 may include a first region AR1 and a second region AR2 adjacent to the first region AR1 in the second direction DR2. The first output pads P1-0 connected to the first pads PD1 (see FIG. 3) may be disposed in the first region AR1. The first region AR1 may have a first width WT1 in a direction parallel to the first direction DR1. The first width WT1 may be a maximum width in the first region AR1. The first input pads P1-1 may be disposed in the second region AR2. The second region AR2 may have a second width WT2 in a direction parallel to the first direction DR1. The second width WT2 may be a maximum width in the second region AR2. The first width WT1 may be greater than the second width WT2.

The first driving chip DC1 may be disposed in the second region AR2. The first driving chip DC1 may transmit a signal received from the main circuit board MPCB (see FIG. 1) to the display panel DP (see FIG. 1).

The second film FM2 may include a second insulating layer IL-F2, a plurality of pads CPD2, P2-0, and P2-1, and a plurality of second signal lines SL-F2. The plurality of pads CPD2, P2-0, and P2-1 and the plurality of second signal lines SL-F2 may be disposed on the second insulating layer. The second insulating layer may include a polyimide layer.

The plurality of pads CPD2, P2-0, and P2-1 may include second connection pads CPD2 connected to connection terminals of the second driving chip DC2, second output pads P2-0 connected to the display panel DP (see FIG. 1), and second input pads P2-1 connected to the main circuit board MPCB (see FIG. 1). A portion of the plurality of second signal lines SL-F2 may connect the second connection pads CPD2 to the second output pads P2-0, and the other portion of the plurality of second signal lines SL-F2 may connect the second connection pads CPD2 to the second input pads P2-1.

The second film FM2 may include a third region AR3 and a fourth region AR4 adjacent to the third region AR3 in the second direction DR2. The second output pads P2-0 connected to the second pads PD2 (see FIG. 3) may be disposed in the third region AR3. The third region AR3 may have a third width WT3 in a direction parallel to the first direction DR1. The third width WT3 may be a maximum width in the third region AR3. The second input pads P2-1 may be disposed in the fourth region AR4. The fourth region AR4 may have a fourth width WT4 in a direction parallel to the first direction DR1. The fourth width WT4 may be a maximum width in the fourth region AR4. The third width WT3 may be greater than the fourth width WT4.

The second driving chip DC2 may be disposed in the third region AR3. The second driving chip DC2 may transmit a signal received from the main circuit board MPCB (see FIG. 1) to the display panel DP (see FIG. 1).

The second width WT2 may be greater than the fourth width WT4. A length LN1 of the first region AR1 in the second direction DR2 may be greater than a length LN2 of the third region AR3 in the second direction DR2. In a plan view, an area of the first connection film CF1 may be greater than an area of the second connection film CF2.

Figure 5A:
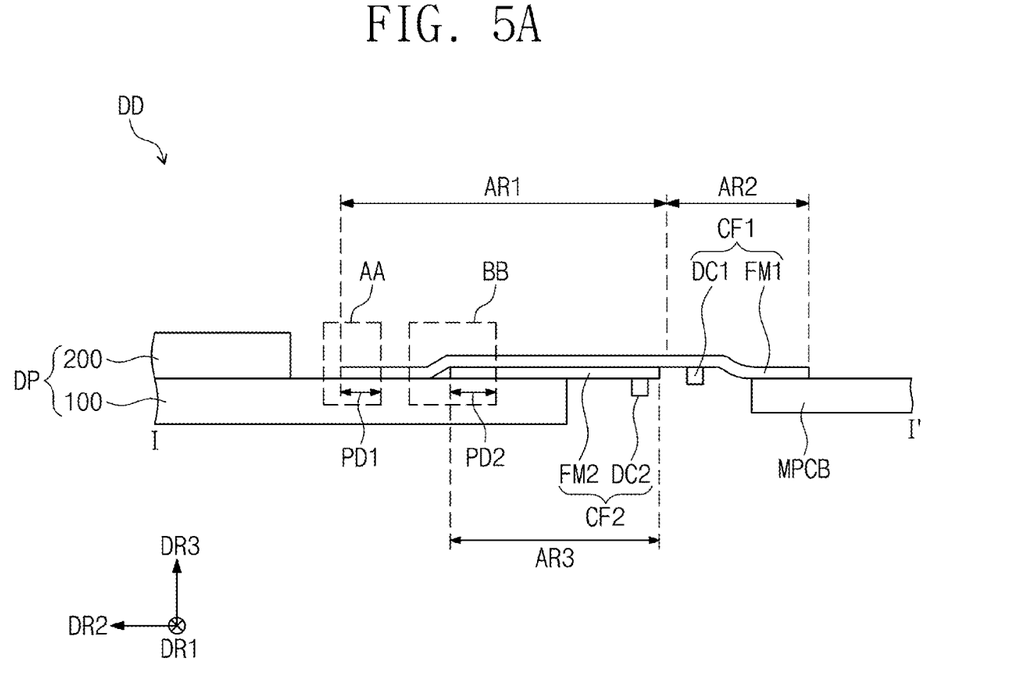
FIG. 5A is a cross-sectional view taken along line I-I' of FIG. 3.
Figure 5B:
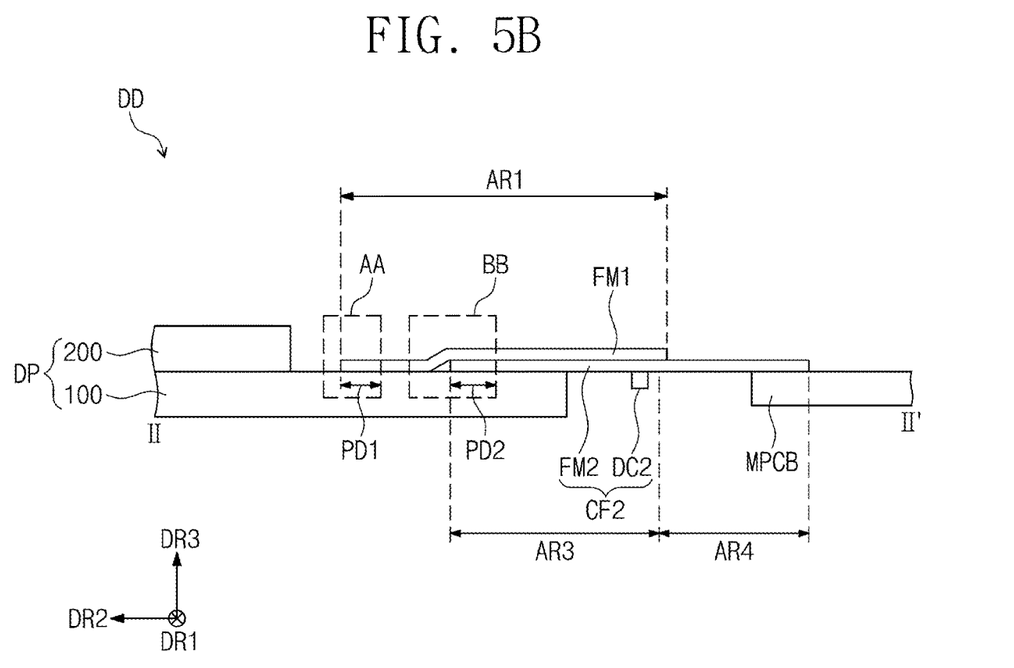
FIG. 5B is a cross-sectional view taken along line II-II' of FIG. 3.

FIG. 5A is a cross-sectional view of the display device, taken along line I-I' of FIG. 3, and FIG. 5B is a cross-sectional view of the display device, taken along line II-II' of FIG. 3.

Referring to FIGS. 5A and 5B, the first connection film CF1 may be connected to the first pads PD1. The second connection film CF2 may be connected to the second pads PD2.

The first driving chip DC1 may be disposed in the second region AR2. The first driving chip DC1 may be disposed on a bottom surface of the first film FM1. In a plan view, the first driving chip DC1 may not overlap the second connection film CF2.

The second driving chip DC2 may be disposed in the third region AR3. The second driving chip DC2 may be disposed on a bottom surface of the second film FM2. In a plan view, the second driving chip DC2 may overlap the first connection film CF1.

A portion of the bottom surface of the first film FM1 and a portion of a top surface of the second film FM2 may be in contact with each other.

The second region AR2 may be connected to the main circuit board MPCB. The fourth region AR4 may be connected to the main circuit board MPCB.

According to the present invention, when the main circuit board MPCB and the first connection film CF1 and the second connection film CF2 are coupled to each other, the first driving chip DC1 and the second driving chip DC2, the first driving chip DC1 and the second film FM2, and the second driving chip DC2 and the first film FM1 may not be in contact with each other in a plan view. Thus, the first driving chip DC1 and the second driving chip DC2 may be effectively prevented from being damaged. Since there is no gap between the first connection film CF1 and the second connection film CF2 due to the first driving chip DC1 and the second driving chip DC2, when the first connection film CF1 and the second connection film CF2 and the main circuit board MPCB are connected to each other, misalignment therebetween may be effectively prevented from occurring. Thus, the display device DD having improved reliability may be provided.

Figure 6A:
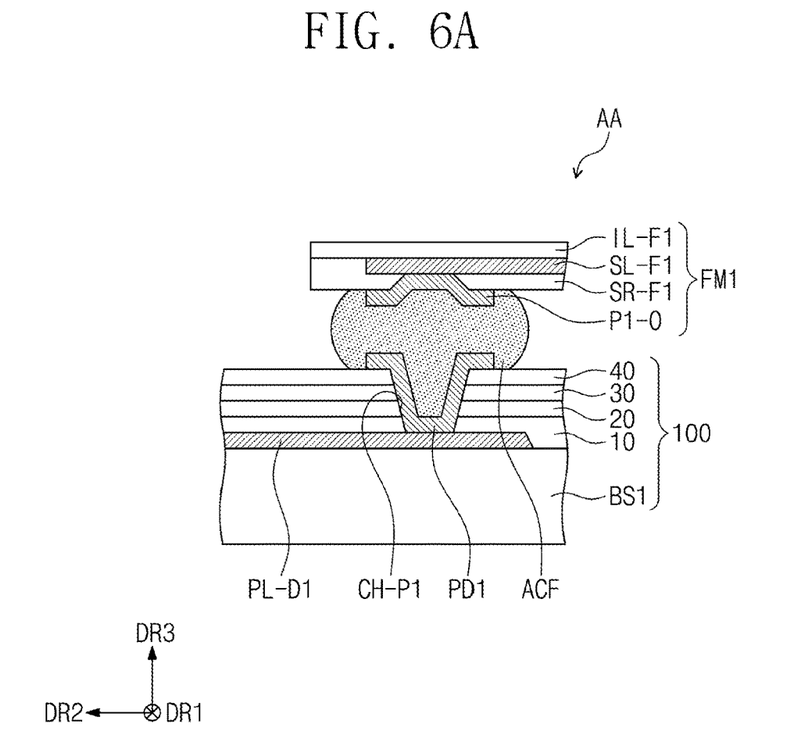
FIG. 6A is enlarged cross-sectional views illustrating an area AA of FIG. 5A.

FIG. 6A is enlarged cross-sectional views illustrating an area AA of FIG. 5A.

Referring to FIG. 6A, the first substrate 100 may include a base layer BS1, a first auxiliary data signal line PL-D1 disposed on the base layer BS1, and a plurality of insulating layers 10 to 40 disposed on the first auxiliary data signal line PL-D1. In FIG. 6A, four insulating layers 10 to 40 are illustrated as an example, but the number of insulating layers 10 to 40 is not limited thereto.

The first pad PD1 may be connected to the first auxiliary data signal line PL-D1 through a contact hole CH-P1 passing through the first to fourth insulating layers 10 to 40.

The first film FM1 may include a first insulating layer IL-F1, a first signal line SL-F1, a first solder resist layer SR-F1, and a first output pad P1-0.

The first film FM1 may be connected to each of the display panel DP and the main circuit board MPCB by a conductive adhesive member ACF. The conductive adhesive member ACF may include an anisotropic conductive film. Hereinafter, the conductive adhesive member ACF will be described as an anisotropic conductive film.

The first signal line SL-F1 may be disposed under the first insulating layer IL-F1. The first solder resist layer SR-F1 may be disposed under the first signal line SL-F1. A portion of the first solder resist layer SR-F1 may be removed, and thus, a portion of the first signal line SL-F1 may be exposed. The first output pad P1-0 may be electrically connected to the first signal line SL-F1. The first output pad P1-0 may be electrically connected to the first pad PD1 through the conductive adhesive member ACF.

Figure 6B:
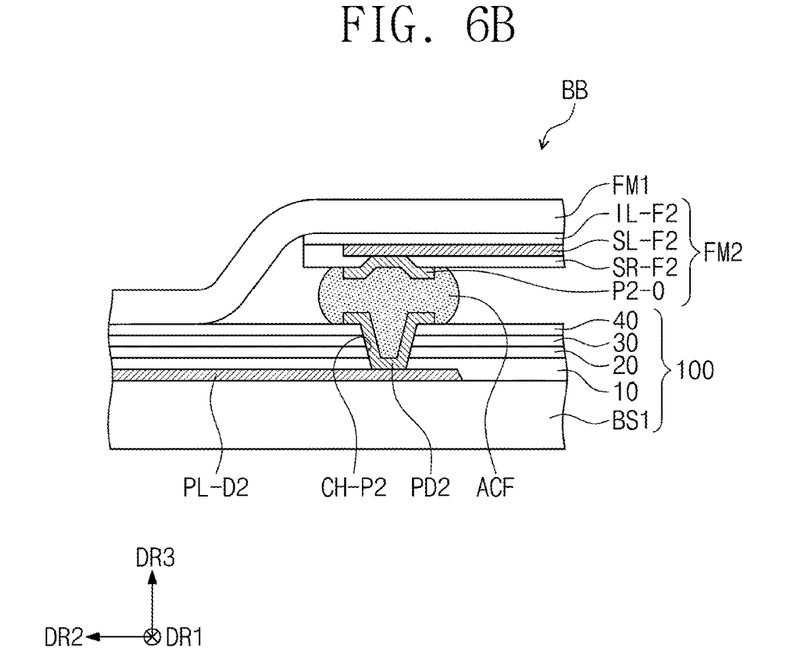
FIG. 6B is enlarged cross-sectional views illustrating an area BB of FIG. 5B.

FIG. 6B is enlarged cross-sectional views illustrating an area BB of FIG. 5B.

Referring to FIG. 6B, the second pad PD2 may be connected to the second auxiliary data signal line PL-D2 through a contact hole CH-P2 passing through the first to fourth insulating layers 10 to 40. The second pad PD2 may be exposed from the first to fourth insulating layers 10 to 40.

The second film FM2 may be disposed between the first substrate 100 and the first film FM1. The second film FM2 may include a second insulating layer IL-F2, a second signal line SL-F2, a second solder resist layer SR-F2, and a second output pad P2-0.

The second film FM2 (see FIG. 3) may be connected to each of the display panel DP and the main circuit board MPCB by the conductive adhesive member ACF. The conductive adhesive member ACF may include an anisotropic conductive film.

The second signal line SL-F2 may be disposed under the second insulating layer IL-F2. The second solder resist layer SR-F2 may be disposed under the second signal line SL-F2. A portion of the second solder resist layer SR-F2 may be removed, and thus, a portion of the second signal line SL-F2 may be exposed. The second output pad P2-0 may be electrically connected to the second signal line SL-F2. The second output pad P2-0 may be electrically connected to the second pad PD2 through the conductive adhesive member ACF.

Figure 7:
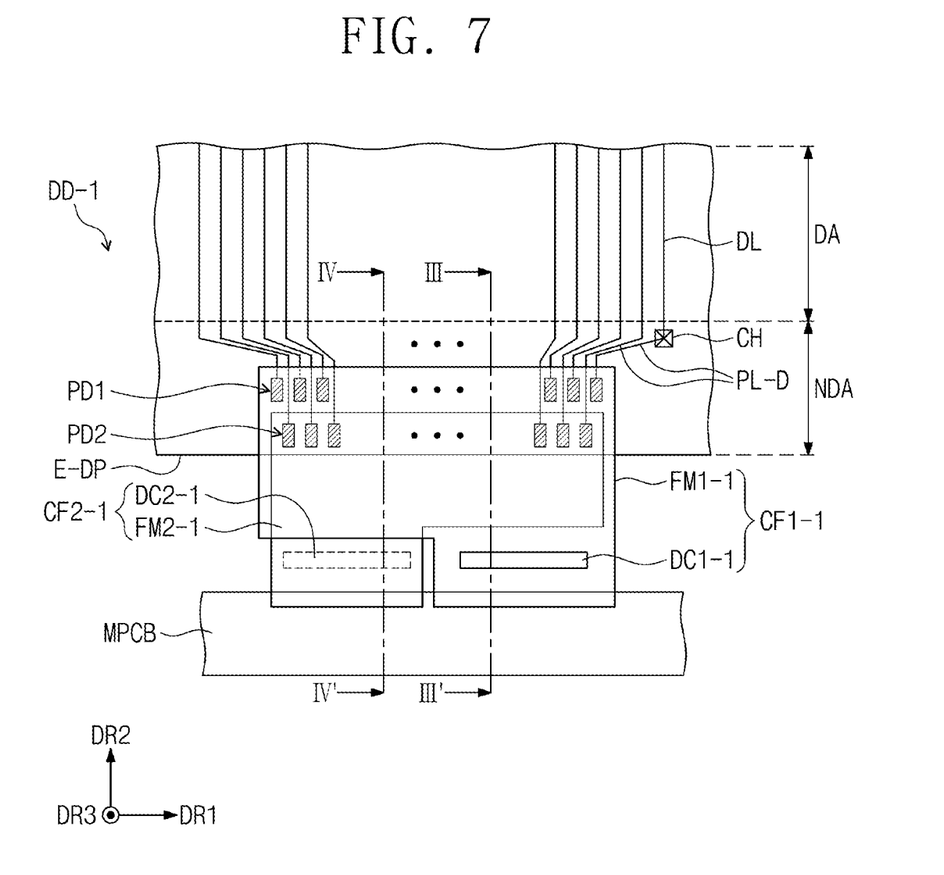
FIG. 7 is an enlarged plan view of the display device according to an embodiment of the present invention.

FIG. 7 is a cross-sectional view of the display device according to an embodiment of the present invention. The same constituents as that described in FIG. 3 will be denoted by the same reference numerals, and descriptions thereof will be omitted.

Referring to FIGS. 3 and 7, the first connection film CF1-1 may be disposed on the second connection film CF2-1. In a plan view, an area of the first connection film CF1-1 may be greater than an area of the second connection film CF2-1. A maximum width of the first connection film CF1-1 in the first direction or the second direction may be greater than a maximum width of the second connection film CF2-1 in the same direction.

In a plan view, the first driving chip DC1-1 may not overlap with the second connection film CF2-1. In a plan view, the second driving chip DC2-1 may not overlap the first connection film CF1-1.

Figure 8A:
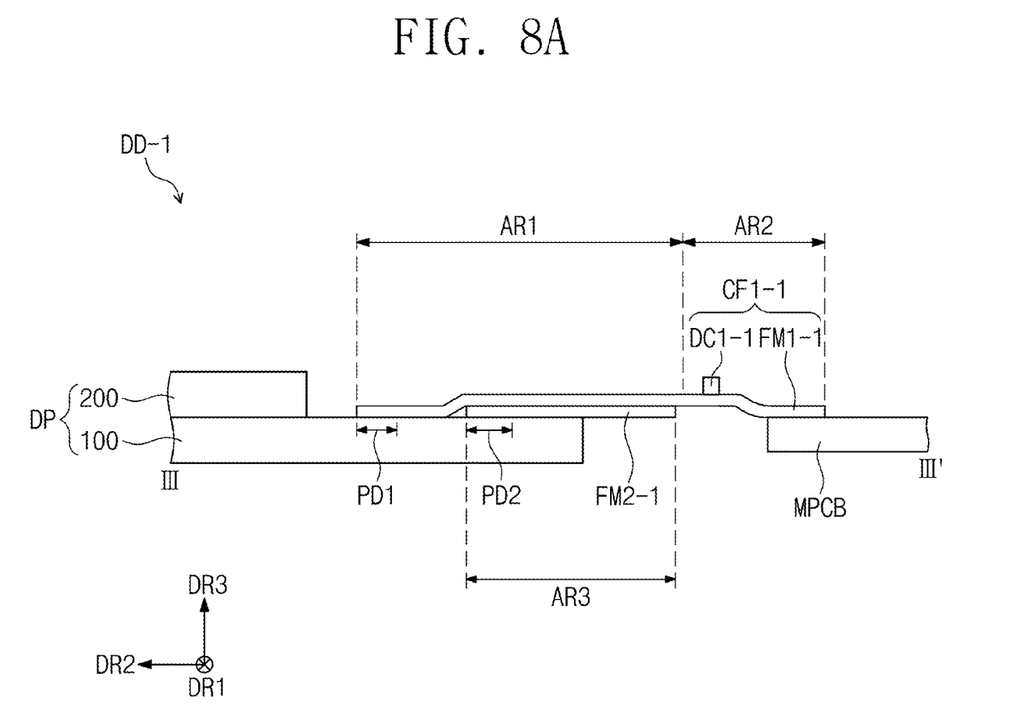
FIG. 8A is a cross-sectional view taken along line III-III' of FIG. 7.
Figure 8B:
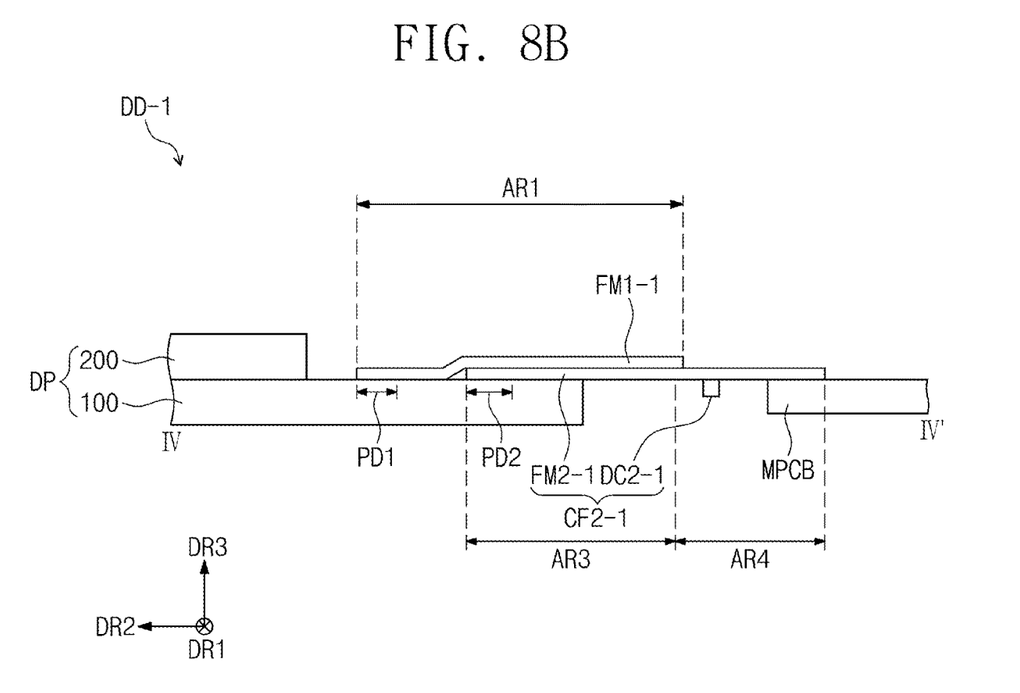
FIG. 8B is a cross-sectional view taken along line IV-IV' of FIG. 7.

FIG. 8A is a cross-sectional view of the display device, taken along line of FIG. 7, and FIG. 8B is a cross-sectional view of the display device, taken along line IV-IV' of FIG. 7. The same reference numeral may be given to components that are the same as the components of FIGS. 5A to 5B, and their detailed descriptions will be omitted.

Referring to FIGS. 8A and 8B, a first driving chip DC1-1 may be disposed in the second region AR2. The first driving chip DC1-1 may be disposed on a top surface of a first film FM1-1. In a plan view, the first driving chip DC1-1 may not overlap a second film FM2-1.

A second driving chip DC2-1 may be disposed in the fourth region AR4. The second driving chip DC2-1 may be disposed on a bottom surface of a second film FM2-1. In a plan view, the second driving chip DC2-1 may not overlap the first film FM1-1.

According to the present invention, when the main circuit board MPCB and the first connection film CF1-1 and the second connection film CF2-1 are coupled to each other, the first driving chip DC1-1 and the second driving chip DC2-1, the first driving chip DC1-1 and the second film FM2-1, and the second driving chip DC2-1 and the first film FM1-1 may not be in contact with each other in a plan view. Thus, the first driving chip DC1-1 and the second driving chip DC2-1 may be effectively prevented from being damaged. Since there is no gap between the first connection film CF1-1 and the second connection film CF2-1 due to the first driving chip DC1-1 and the second driving chip DC2-1, when the first connection film CF1-1 and the second connection film CF2-1 and the main circuit board are connected to each other, misalignment therebetween may be effectively prevented from occurring. Thus, the display device DD-1 having improved reliability may be provided.

Figure 9:
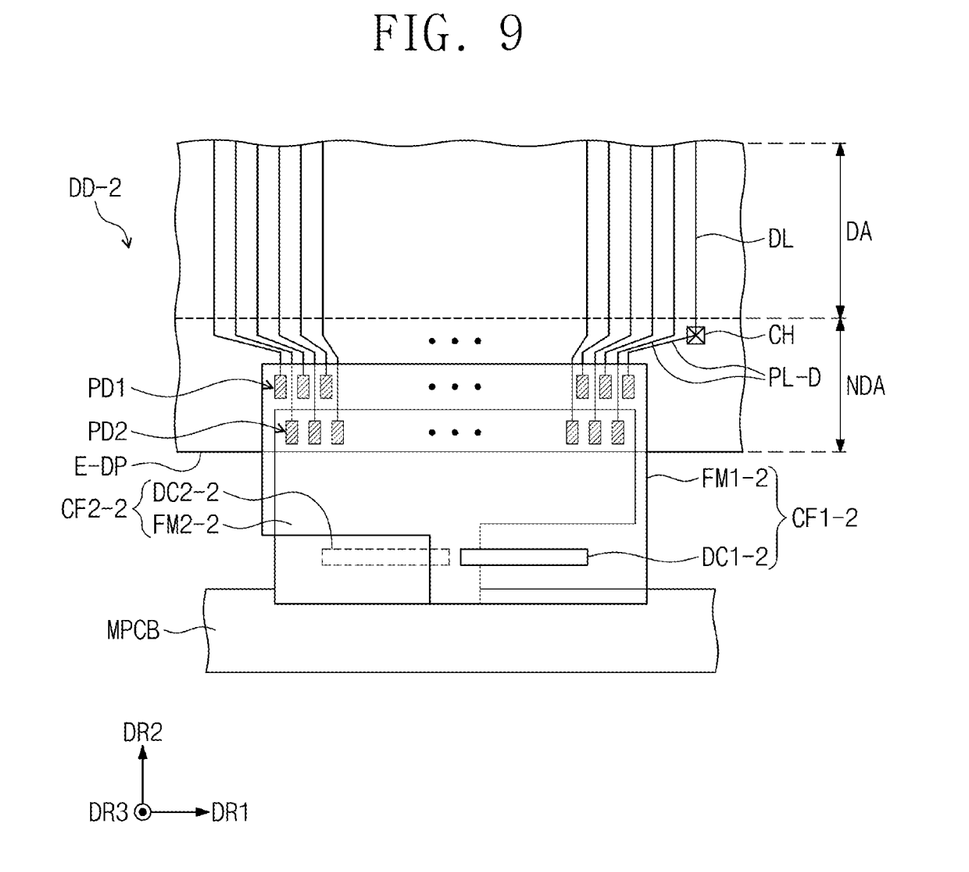
FIG. 9 is an enlarged plan view of a display device according to an embodiment of the present invention.

FIG. 9 is a cross-sectional view of a display device according to an embodiment of the present invention. The same constituents as that described in FIG. 3 will be denoted by the same reference numerals, and descriptions thereof will be omitted.

Referring to FIGS. 3 and 9, a first connection film CF1-2 may be disposed on a second connection film CF2-2.

In a plan view, a portion of a first driving chip DC1-2 may overlap a portion of a second connection film CF2-2. The first driving chip DC1-2 may be disposed on a top surface of a first film FM1-2.

In a plan view, a portion of a second driving chip DC2-2 may overlap a portion of the first connection film CF1-2. The second driving chip DC2-2 may be disposed on a bottom surface of a second film FM2-2.

In a plan view, the first driving chip DC1-2 and the second driving chip DC2-2 may be spaced apart from each other in the first direction DR1. The first driving chip DC1-2 and the second driving chip DC2-2 may be disposed in a virtual line extending in the first direction DR1. When viewed in the first direction DR1, the first driving chip DC1-2 and the second driving chip DC2-2 may overlap each other.

According to the present invention, when the main circuit board MPCB and the first connection film CF1-2 and the second connection film CF2-2 are coupled to each other, the first driving chip DC1-2 and the second driving chip DC2-2, the first driving chip DC1-2 and the second film FM2-2, and the second driving chip DC2-2 and the first film FM1-2 may not be in contact with each other in a plan view. Thus, the first driving chip DC1-2 and the second driving chip DC2-2 may be effectively prevented from being damaged. Since there is no gap between the first connection film CF1-2 and the second connection film CF2-2 due to the first driving chip DC1-2 and the second driving chip DC2-2, when the first connection film CF1-2 and the second connection film CF2-2 and the main circuit board MPCB are connected to each other, misalignment therebetween may be effectively prevented from occurring. Thus, the display device DD-2 having improved reliability may be provided.

Figure 10:
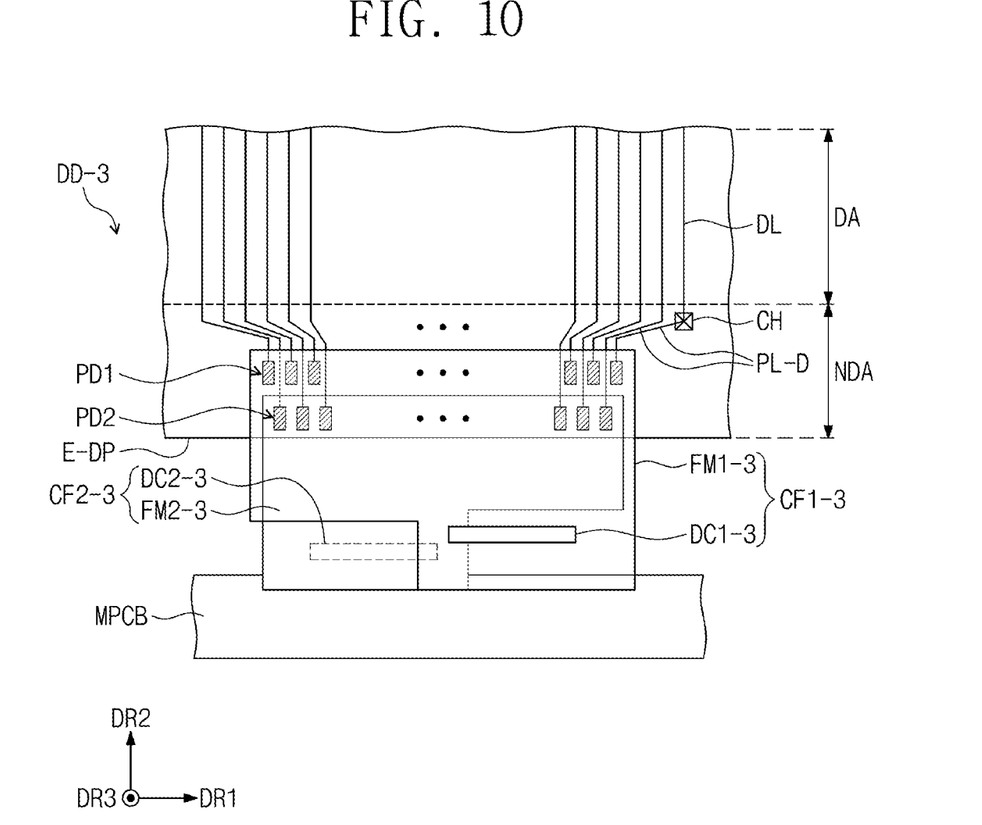
FIG. 10 is an enlarged plan view of a display device according to an embodiment of the present invention.

FIG. 10 is a cross-sectional view of a display device according to an embodiment of the present invention. The same constituents as that described in FIG. 3 will be denoted by the same reference numerals, and descriptions thereof will be omitted.

Referring to FIGS. 3 and 10, the first connection film CF1-3 may be disposed on the second connection film CF2-3.

In a plan view, a portion of a first driving chip DC1-3 may overlap a portion of a second connection film CF-2-3. The first driving chip DC1-3 may be disposed on a top surface of a first film FM1-3.

In a plan view, a portion of a second driving chip DC2-3 may overlap a portion of the first connection film CF1-3. The second driving chip DC2-3 may be disposed on a bottom surface of a second film FM2-3.

The first driving chip DC1-3 and the second driving chip DC2-3 may be alternately disposed in a plan view. When viewed in the first direction DR1, the first driving chip DC1-3 and the second driving chip DC2-3 may not overlap each other.

According to the present invention, when the main circuit board MPCB and the first connection film CF1-3 and the second connection film CF2-3 are coupled to each other, the first driving chip DC1-3 and the second driving chip DC2-3, the first driving chip DC1-3 and the second film FM2-3, and the second driving chip DC2-3 and the first film FM1-3 may not be in contact with each other in a plan view. Thus, the first driving chip DC1-3 and the second driving chip DC2-3 may be effectively prevented from being damaged. Since there is no gap between the first connection film CF1-3 and the second connection film CF2-3 due to the first driving chip DC1-3 and the second driving chip DC2-3, when the first connection film CF1-3 and the second connection film CF2-3 and the main circuit board MPCB are connected to each other, misalignment therebetween may be effectively prevented from occurring. Thus, the display device DD-3 having improved reliability may be provided.

It will be apparent to those skilled in the art that various modifications and deviations can be made in the present invention. Thus, it is intended that the present disclosure covers the modifications and deviations of this invention provided they come within the scope of the appended claims and their equivalents. Accordingly, the technical scope of the present invention should not be limited to the contents described in the detailed description of the specification, but should be determined by the claims.

INDUSTRIAL APPLICABILITY

In the display device, the driving chip disposed on the connection film connected to the main circuit board may be effectively prevented from being damaged to improve the reliability of the display device. Therefore, the present invention relating to the display device has high industrial applicability.

The invention claimed is:
1. A display device comprising:
a display panel comprising first pads arranged in a first direction and second pads arranged in the first direction and spaced apart from the first pads in a second direction crossing the first direction;
a first connection film comprising 1) a first film, which comprises a first region connected to the first pads and having a first width in the first direction and a second region adjacent to the first region in the second direction and having in the first direction a second width that is different from the first width, and 2) a first driving chip mounted on the first film; and
a second connection film comprising 1) a second film, which comprises a third region connected to the second pads and having a third width in the first direction and a fourth region adjacent to the third region in the second direction and having in the first direction a fourth width that is different from the third width and less than the second width, and 2) a second driving chip mounted on the second film.

2. The display device of claim 1, wherein the first width is greater than the second width, and
the third width is greater than the fourth width.

3. The display device of claim 1, wherein a length of the first region in the second direction is greater than a length of the third region in the second direction.

4. The display device of claim 1, wherein the first region and the third region overlap each other in a plan view.

5. The display device of claim 1, wherein an area of the first connection film is greater than an area of the second connection film.

6. The display device of claim 1, wherein the first driving chip is disposed on a bottom surface of the first film, and the second driving chip is disposed on a bottom surface of the second film.

7. The display device of claim 6, wherein the first driving chip is disposed in the second region, and
the second driving chip is disposed in the third region.

8. The display device of claim 7, wherein the first driving chip does not overlap the second connection film in a plan view, and the second driving chip overlaps the first connection film in the plan view.

9. The display device of claim 1, wherein the first driving chip is disposed on a top surface of the first film, and the second driving chip is disposed on a bottom surface of the second film.

10. The display device of claim 9, wherein the first driving chip overlaps the second film in a plan view, and
the second driving chip overlaps the first film in the plan view.

11. The display device of claim 9, wherein the first driving chip is disposed in the second region, and
the second driving chip is disposed in the fourth region.

12. The display device of claim 1, wherein a portion of a bottom surface of the first film and a portion of a top surface of the second film are in contact with each other.

13. The display device of claim 1, further comprising a main circuit board connected to the second region and the fourth region.

14. A display device comprising:
a display panel comprising a substrate which comprises a display area and a non-display area, first pads disposed on the non-display area, and second pads disposed on the non-display area and spaced apart from the display area with the first pads therebetween;
a main circuit board electrically connected to the display panel;
a first connection film comprising 1) a first film, which comprises a first region connected to the first pads and a second region connected to the main circuit board and protruding from the first region, and 2) a first driving chip mounted on the first film; and
a second connection film disposed under the first connection film, the second connection film comprising 1) a second film, which comprises a third region connected to the second pads and a fourth region connected to the main circuit board and protruding from the third region, and 2) a second driving chip mounted on the second film,
wherein the second region has a width greater than a width of the fourth region.

15. The display device of claim 14, wherein the first pads are arranged in a first direction, the second pads are arranged in the first direction, and the width of the second region and the width of the fourth region are defined as widths in a direction parallel to the first direction.

16. The display device of claim 15, wherein the first region has a width in the first direction greater than the width of the second region, and
the third region has a width in the first direction greater than the width of the fourth region.

17. The display device of claim 14, wherein the first driving chip is disposed on a bottom surface of the second region, and
the second driving chip is disposed on a bottom surface of the third region.

18. The display device of claim 17, wherein the first driving chip does not overlap the second film in a plan view, and
the second driving chip overlaps the first film in the plan view.

19. The display device of claim 14, wherein the first driving chip is disposed on a top surface of the second region, and
the second driving chip is disposed on a bottom surface of the fourth region.

20. The display device of claim 19, wherein the first driving chip overlaps the second film in a plan view, and
the second driving chip overlaps the first film in the plan view.

* * * * *